United States Patent
Kadoguchi

(10) Patent No.: US 9,824,994 B2
(45) Date of Patent: Nov. 21, 2017

(54) SEMICONDUCTOR DEVICE IN WHICH AN ELECTRODE OF A SEMICONDUCTOR ELEMENT IS JOINED TO A JOINED MEMBER AND METHODS OF MANUFACTURING THE SEMICONDUCTOR DEVICE

(71) Applicant: TOYOTA JIDOSHA KABUSHIKI KAISHA, Toyota-shi, Aichi-ken (JP)

(72) Inventor: Takuya Kadoguchi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/924,194

(22) Filed: Oct. 27, 2015

(65) Prior Publication Data

US 2016/0126207 A1  May 5, 2016

(30) Foreign Application Priority Data

Oct. 30, 2014 (JP) .................................. 2014-221341

(51) Int. Cl.
*H01L 23/48* (2006.01)
*H01L 23/00* (2006.01)
(Continued)

(52) U.S. Cl.
CPC .......... *H01L 24/32* (2013.01); *H01L 21/4853* (2013.01); *H01L 23/488* (2013.01);
(Continued)

(58) Field of Classification Search
CPC ............. H01L 21/4853; H01L 23/4334; H01L 23/488; H01L 23/4924; H01L 23/49582;
(Continued)

(56) References Cited

U.S. PATENT DOCUMENTS

2004/0007384 A1  1/2004  Soga et al.
2007/0057021 A1  3/2007  Biocher
(Continued)

FOREIGN PATENT DOCUMENTS

EP  1 760 783 A2  3/2007
EP  2276063 A2  1/2011
(Continued)

OTHER PUBLICATIONS

Ikeda et al., "Development of High Heatproff Lead-free Bonding Technology for Product Used at High Temperature", 14th Symposium on "Microjoining and Assembly Technology in Electronics", 2008, pp. 101-104.
(Continued)

*Primary Examiner* — Hung Vu
(74) *Attorney, Agent, or Firm* — Oliff PLC

(57) ABSTRACT

A semiconductor device includes: a semiconductor element; a joined member that is joined to the semiconductor element and includes a nickel film; and a joining layer that is joined to the joined member and contains 2.0 wt % or higher of copper, in which the joining layer includes a solder portion and a $Cu_6Sn_5$ portion, base metal of the solder portion contains at least tin as a constituent element and contains elemental copper, and the $Cu_6Sn_5$ portion is in contact with the nickel film.

7 Claims, 4 Drawing Sheets

(51) Int. Cl.
*H01L 21/48* (2006.01)
*H01L 23/492* (2006.01)
*H01L 23/488* (2006.01)
*H01L 23/495* (2006.01)
*H01L 23/433* (2006.01)

(52) U.S. Cl.
CPC .......... *H01L 23/4924* (2013.01); *H01L 24/29* (2013.01); *H01L 24/83* (2013.01); *H01L 23/4334* (2013.01); *H01L 23/49537* (2013.01); *H01L 23/49582* (2013.01); *H01L 24/05* (2013.01); *H01L 24/33* (2013.01); *H01L 2224/04026* (2013.01); *H01L 2224/05655* (2013.01); *H01L 2224/292* (2013.01); *H01L 2224/29211* (2013.01); *H01L 2224/29347* (2013.01); *H01L 2224/32245* (2013.01); *H01L 2224/32503* (2013.01); *H01L 2224/32505* (2013.01); *H01L 2224/33181* (2013.01); *H01L 2224/8381* (2013.01); *H01L 2224/83455* (2013.01); *H01L 2224/83815* (2013.01); *H01L 2924/181* (2013.01)

(58) Field of Classification Search
CPC ......... H01L 24/29; H01L 24/32; H01L 24/83; H01L 2224/32503; H01L 2224/32505
USPC .................................................. 257/762, 766
See application file for complete search history.

(56) References Cited

U.S. PATENT DOCUMENTS

| | | | |
|---|---|---|---|
| 2009/0134501 A1 | 5/2009 | Ganitzer et al. | |
| 2009/0236725 A1 | 9/2009 | Hirano et al. | |
| 2009/0243089 A1 | 10/2009 | Hohlfeld et al. | |
| 2010/0291399 A1 | 11/2010 | Kato et al. | |
| 2011/0006415 A1 | 1/2011 | Bachman et al. | |
| 2011/0042815 A1 | 2/2011 | Ikeda et al. | |
| 2011/0291282 A1 | 12/2011 | Yamada et al. | |
| 2012/0208323 A1 | 8/2012 | Heinrich et al. | |
| 2013/0270327 A1* | 10/2013 | Yoon ..................... | B23K 20/16 228/176 |
| 2016/0126204 A1* | 5/2016 | Kadoguchi ............. | H01L 24/16 257/737 |
| 2016/0126207 A1 | 5/2016 | Kadoguchi | |

FOREIGN PATENT DOCUMENTS

| | | |
|---|---|---|
| JP | 2003-264366 A | 9/2003 |
| JP | 2005-340275 A | 12/2005 |
| JP | 2007-067158 A | 3/2007 |
| JP | 2010-179336 A | 8/2010 |
| JP | 2011-044624 A | 3/2011 |
| JP | 2011-233879 A | 11/2011 |
| JP | 2013-197427 A | 9/2013 |
| JP | 5369682 B2 | 12/2013 |
| JP | 5517694 B2 | 6/2014 |
| JP | 2014-199852 A | 10/2014 |
| JP | 2016-092063 A | 5/2016 |
| KR | 2009-0046954 A | 5/2009 |
| KR | 20110006615 A | 1/2011 |

OTHER PUBLICATIONS

Ikeda et al., "Joint Reliability of High Heatproff Bonding by Sn—Cu Solder," 15th Symposium on "Microjoining and Assembly Technology in Electronics", 2009, pp. 59-64.

Laurila T. et al, "Interfacial reactions between lead-free solders and common base materials", Materials Science and Engineering, 2005, pp. 1-60.

May 4, 2016 Office Action issued in U.S. Appl. No. 14/925,267.

Effect of Supersaturation of Cu on Reaction, pp. 2109-2114, No. 9, vol. 18, J. Mater. Res., Sep. 2009.

Feb. 14, 2017 Notice of Allowance issued in U.S. Appl. No. 14/925,267.

* cited by examiner

← 2b(Cu)
← 2a(Ni)
← 4b(Cu$_6$Sn$_5$)
← 4a(Sn0.7Sn)

← 2b(Cu)
← 2a(Ni)
← Ni$_3$Sn$_4$
← Sn0.7Sn

SEMICONDUCTOR DEVICE IN WHICH AN ELECTRODE OF A SEMICONDUCTOR ELEMENT IS JOINED TO A JOINED MEMBER AND METHODS OF MANUFACTURING THE SEMICONDUCTOR DEVICE

INCORPORATION BY REFERENCE

The disclosure of Japanese Patent Application No. 2014-221341 filed on Oct. 30, 2014 including the specification, drawings and abstract is incorporated herein by reference in its entirety.

BACKGROUND OF THE INVENTION

1. Field of the Invention

The present invention relates to a semiconductor device and a method of manufacturing a semiconductor device. In particular, the invention relates to a semiconductor device in which an electrode of a semiconductor element is joined to a joined member.

2. Description of Related Art

Japanese Patent Application Publication No. 2007-67158 (JP 2007-67158 A) discloses a semiconductor device in which a semiconductor element is joined to a joined member. In JP 2007-67158 A, the semiconductor element is joined to the joined member through a Sn—Cu solder (mixed alloy solder of tin and copper). The proportion of Cu constituting the solder is adjusted to be 3.0 wt % to 7.0 wt % (percent by weight). That is, the semiconductor element is joined to the joined member through a Sn-3.0 to 7.0 Cu solder. JP 2007-67158 A describes that, when molten solder is solidified, a $Cu_6Sn_5$ compound is formed on a surface of the joined member. Due to the formation of the $Cu_6Sn_5$ compound, diffusion between the solder and the joined member is prevented.

As described in JP 2007-67158 A, when a Sn—Cu solder containing lower than 0.9 wt % of Cu is used, theoretically, a $Cu_6Sn_5$ compound is not formed on a surface of a joined member. Therefore, JP 2007-67158 A describes that a semiconductor element is joined to a joined member through a Sn—Cu solder containing 0.9 wt % or higher of Cu. In the description, as described above, it is more preferable that the proportion of Cu in the Sn—Cu solder is adjusted to be 3.0 wt % to 7.0 wt %.

SUMMARY OF THE INVENTION

However, when the proportion of Cu constituting a Sn—Cu solder increases, the melting point (or liquidus temperature) of the solder increases. For example, in the case of a Sn-3.0 Cu solder, the liquidus temperature is higher than 310° C. When a solder having a high melting point (liquidus temperature) is used, it is necessary that the heat resistance of a semiconductor element is improved to prevent the semiconductor element from being damaged. Therefore, a semiconductor device in which a $Cu_6Sn_5$ compound is formed on a surface of a joined member without improvement of the heat resistance of the semiconductor element is required.

According to an aspect of the invention, there is provided a semiconductor device including: a semiconductor element; a joined member that is joined to the semiconductor element and includes a nickel film; and a joining layer that is joined to the joined member and contains 2.0 wt % or higher of copper, in which the joining layer includes a solder portion and a $Cu_6Sn_5$ portion, base metal of the solder portion contains at least tin as a constituent element and contains elemental copper, and the $Cu_6Sn_5$ portion is in contact with the nickel film.

"Solder portion" refers to a portion of the joining layer where the semiconductor element is joined to the joined member. On the other hand, a material for forming the joining layer (that is, a material before being melted to form the joining layer) is called "solder material" and is distinguished from the "solder portion". In addition, "$Cu_6Sn_5$ portion (or $Cu_6Sn_5$)" includes a compound in which a part of Cu is substituted with Ni. That is, "$Cu_6Sn_5$ portion (or $Cu_6Sn_5$)" includes $(Cu,Ni)_6Sn_5$. For example, when a Sn—Cu solder to which Ni is added is used, Ni is solid-solubilized in $Cu_6Sn_5$ to form $(Cu,Ni)_6Sn_5$. $Cu_6Sn_5$ and $(Cu,Ni)_6Sn_5$ exhibit substantially the same function. The joined member is not limited to a member that is directly joined to the semiconductor element, and includes a member that is joined to a member joined to the semiconductor element. That is, the joined member described in this specification refers to a member that is directly or indirectly joined to the semiconductor element.

In the semiconductor device, the solder portion contains elemental Cu contained in the base metal. This implies that the base metal of the solder material used to join the semiconductor element to the joined member contains elemental Cu. The elemental Cu does not constitute the base metal. The elemental Cu contained in the base metal of the solder material may be a Cu component for forming the $Cu_6Sn_5$ portion when the solder material is melted and then solidified to join the semiconductor element to the joined member. Therefore, during the joining using this solder material, even when the proportion of Cu in the base metal of the solder material (proportion of Cu present in the base metal as an alloy) is low, the $Cu_6Sn_5$ portion can be formed. For example, when the semiconductor element is joined to the joined member through the solder material in which elemental Cu is introduced into the base metal, the $Cu_6Sn_5$ portion can be formed in a part of the joining layer even in a case where the proportion of Cu contained in the base metal of the solder material as an alloy is lower than 0.9 wt %. In particular, in this semiconductor device, the proportion of copper contained in the joining layer is 2.0 wt % or higher. In this way, when the joining layer contains 2.0 wt % or higher of copper, the $Cu_6Sn_5$ portion can be reliably obtained. In addition, by introducing elemental Cu into the base metal of the solder material, the proportion of Cu contained in the base metal of the solder material as an alloy can be reduced. Accordingly, the melting point (or liquidus temperature) of the solder material can be reduced. Therefore, high heat resistance is not necessary required for the semiconductor element.

According to another aspect of the invention, there is provided a method of manufacturing a semiconductor device including: joining a semiconductor element to a joined member, which includes a nickel film, through a solder material whose base metal contains at least tin as a constituent element and contains elemental copper in which a proportion of copper is 2.0 wt % or higher.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
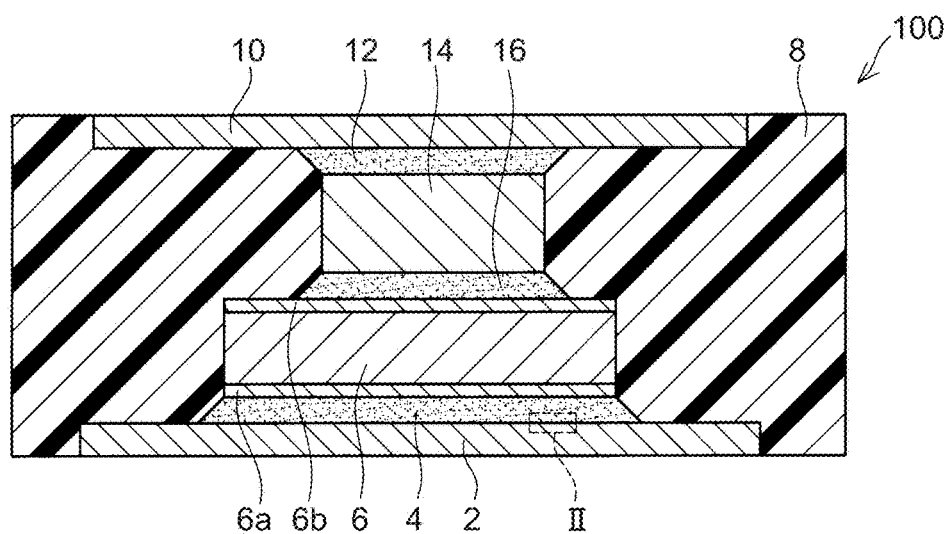
FIG. 1 is a schematic diagram showing a semiconductor device.

Referring to FIG. 1, a semiconductor device 100 will be described. In the semiconductor device 100, a semiconductor element 6 is arranged between two metal plates 2, 10, and the components are molded with a resin 8. The metal plates 2, 10 correspond to electrode plates of the semiconductor device 100. In addition, the metal plates 2, 10 correspond to heat sinks that dissipate heat of the semiconductor element 6 to the outside of the semiconductor device 100. One surface of each of the metal plates 2, 10 is exposed from the surface of the resin 8. In FIG. 1, a terminal, a bonding wire, and the like connected to the semiconductor element 6 are not shown.

A joining layer 4 is provided between the semiconductor element 6 and the metal plate 2. More specifically, an electrode 6a provided on the metal plate 2 side (hereinafter, referred to as "back surface") of the semiconductor element 6 is soldered to the metal plate 2. In addition, an electrode 6b provided on the metal plate 10 side (hereinafter, referred to as "front surface") of the semiconductor element 6 is soldered to a back surface of a metal spacer 14. A front surface of the spacer 14 is soldered to a back surface of the metal plate 10. That is, the semiconductor element 6 is joined to the metal plate 2 through the joining layer 4, the semiconductor element 6 is joined to the spacer 14 through a joining layer 16, and the spacer 14 is joined to the metal plate 10 through a joining layer 12. It can be said that the metal plate 10 is indirectly joined to the semiconductor element 6. The metal plates 2, 10 and the spacer 14 are examples of the joined member.

Surfaces of the semiconductor element 6, the metal plates 2, 10, the spacer 14, and the joining layers 4, 12, 16 are coated with a primer (not shown). By using the primer, the joining properties between the resin 8; and the semiconductor element 6, the metal plates 2, 10, the spacer 14, and the joining layers 4, 12, and 16 are improved. A thermosetting polyimide resin is used as the primer, and an epoxy resin is used as the resin 8.

Figure 2:
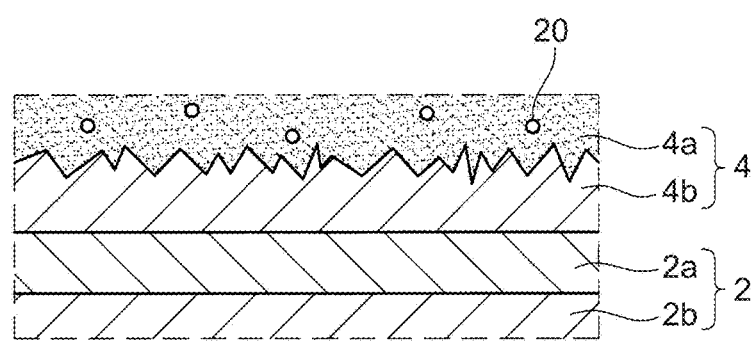
FIG. 2 is an enlarged view showing a portion of FIG. 1 surrounded by broken lines.

FIG. 2 schematically shows an interface between the metal plate 2 and the joining layer 4. As shown in FIG. 2, the metal plate 2 includes a Cu portion 2b and a Ni film 2a. The Cu portion 2b has a plate shape. The Ni film 2a covers the surface of the Cu portion 2b. The thickness of the Ni film 2a is adjusted to be 2 μm to 20 μm. The joining layer 4 includes a solder portion 4a and a $Cu_6Sn_5$ portion 4b. In the solder portion 4a, Cu particles 20 (elemental Cu) are dispersed in Sn-0.7 Cu which is base metal. In the following description, the Cu particles 20 will also be referred to as Cu balls 20. A Cu portion and a Ni film which covers a surface of the Cu portion are also provided on a surface of the electrode 6a. Therefore, an interface between the electrode 6a and the joining layer 4 also has the same configuration as the interface between the metal plate 2 and the joining layer 4.

The solder portion 4a contains 1.3 wt % of the Cu balls 20. In addition, as described above, since the base metal of the solder portion 4a is Sn-0.7 Cu, the base metal contains Cu as an alloy. The proportion of Cu to the total weight of the solder portion 4a is 2.0 wt %. The $Cu_6Sn_5$ portion 4b is in contact with the Ni film 2a. The thickness of the $Cu_6Sn_5$ portion 4b is adjusted to be 3 μm to 20 μm. The $Cu_6Sn_5$ portion 4b is deposited from the solder material (Sn-0.7 Cu solder containing 1.3 wt % of the Cu balls 20) through which the metal plate 2 and the semiconductor element 6 are joined to each other. The thickness of the $Cu_6Sn_5$ portion 4b is much smaller than that of the solder portion 4a. Therefore, the configuration of the solder material before the metal plate 2 and the semiconductor element 6 are joined to each other is substantially the same as the configuration of the solder portion 4a after the metal plate 2 and the semiconductor element 6 are joined to each other.

A step of joining the semiconductor element 6 to the metal plate 2 will be described. The semiconductor element 6, in which the Ni film is formed on the surface of the electrode 6a, and the metal plate 2, in which Ni is electroplated on the surface of the Cu plate, are prepared. Next, the electrode 6a of the semiconductor element 6 and the metal plate 2 are joined to each other through the solder material. As described above, the solder material has substantially the same configuration as the solder portion 4a. That is, the base metal of the solder material is Sn-0.7 Cu. The Cu balls 20 are contained in the base metal of the solder material in a state where of being dispersed therein. The proportion of Cu to the total weight of the solder material is 2.0 wt %. In the joining step, first, the solder material is arranged to be in contact with the Ni film 2a of the metal plate 2 and the electrode 6a of the semiconductor element 6. Next, the solder material is melted by heating and then is solidified. By the solder material being solidified, the joining layer 4 is formed. The Ni film 2a of the metal plate 2 and the electrode 6a of the semiconductor element 6 are joined to each other through the joining layer 4.

When the solder material is solidified, $Cu_6Sn_5$ is deposited on the surface of the Ni film 2a. As a result, as shown in FIG. 2, the $Cu_6Sn_5$ portion 4b is formed. In the related art, when the proportion of Cu constituting the solder material decreases, $Cu_6Sn_5$ is not deposited on the surface of the Ni film. On the other hand, in the embodiment, the Cu balls 20 are dispersed in the base metal of the solder material. The Cu balls 20 may be a material of $Cu_6Sn_5$. Accordingly, although the proportion of Cu constituting the solder material is low (0.7 wt %), the $Cu_6Sn_5$ portion 4b can be formed during the solidification of the solder material. As described above, the proportion of Cu in the solder material containing the base metal and the Cu balls is 2.0 wt %. When the proportion of Cu in the solder material is 2.0 wt %, the $Cu_6Sn_5$ portion 4b can be reliably formed.

Figure 3:
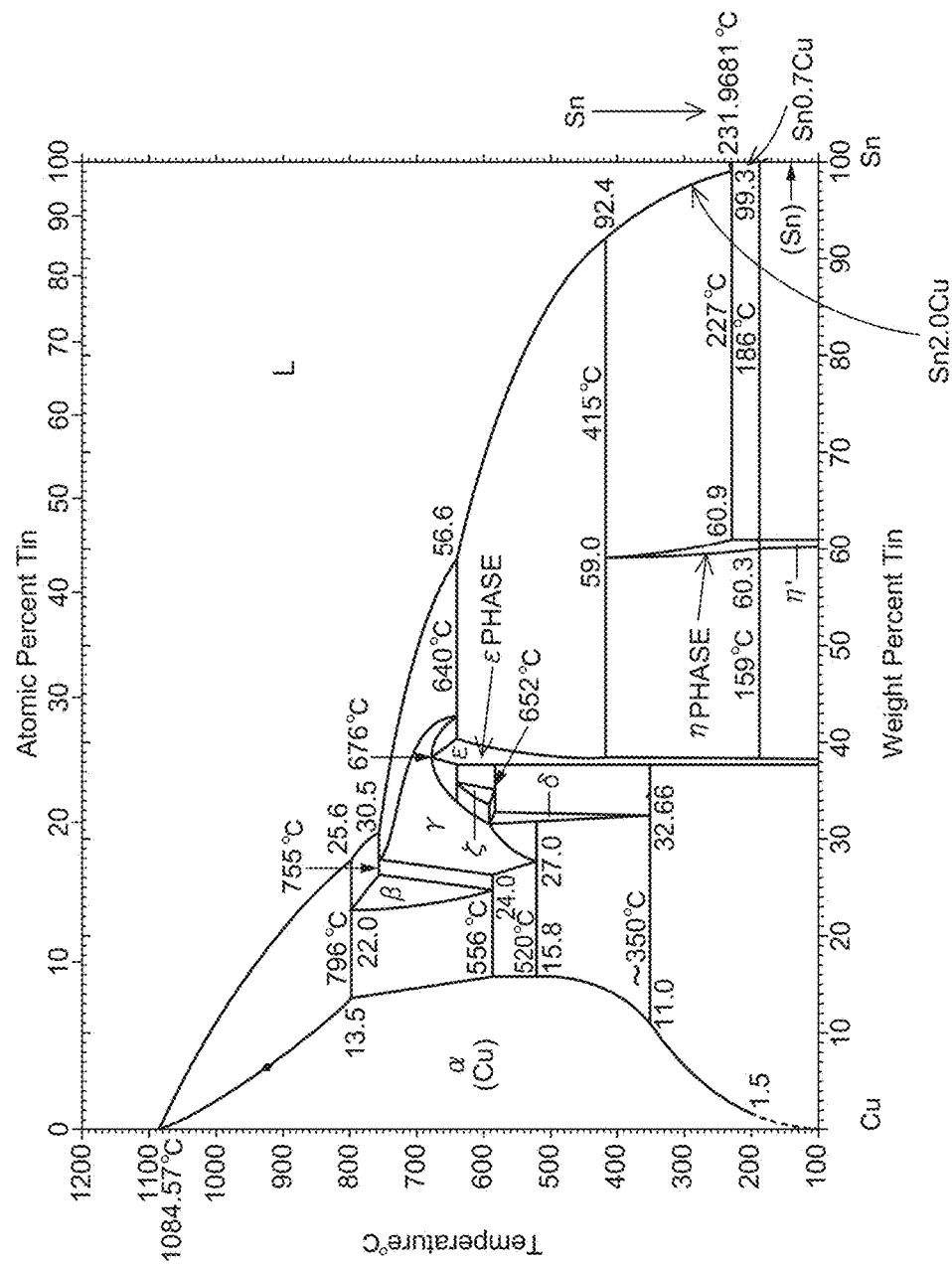
FIG. 3 is a Cu—Sn binary phase diagram.

By the solder material containing the Cu balls 20, the proportion of Cu contained in the base metal of the solder material as an alloy is suppressed to be low at 0.7 wt %. In this way, by suppressing the proportion of Cu contained in the base metal of the solder material, the melting point (or liquidus temperature) of the solder material can be reduced. As shown in FIG. 3, the melting point of Sn-0.7 Cu is 227° C., which is lower than the liquidus temperature of Sn-2.0 Cu (270° C. to 280° C.). When the semiconductor element 6 and the metal plate 2 are joined to each other, the temperature applied to the semiconductor element 6 can be reduced to be lower than that of a case where a solder material of Sn-2.0 Cu containing no Cu balls is used for the joining Therefore, with the method according to the embodiment, the temperature applied to the semiconductor element 6 in the soldering step can be reduced.

As in the metal plate 2, in the metal plate 10, Ni is electroplated on the surface of the Cu plate. In the spacer 14, Ni is electroplated on both surfaces (front surface and back surface) of the Cu plate. In addition, a Ni film is formed on the surface of the electrode 6b. The joint portion between the electrode 6b and the spacer 14 and the joint portion between the spacer 14 and the metal plate 10 have substantially the same structure as the joint portion between the semiconductor element 6 and the metal plate 2. Therefore, the description of the interface between the semiconductor element 6 and the joining layer 16, the interface between the spacer 14 and the joining layer 16, the interface between the spacer 14 and the joining layer 12, and the interface between the metal plate 10 and the joining layer 12 will be replaced with the description of the interface between the metal plate 2 and the joining layer 4.

The advantageous effects of the semiconductor device 100 will be described. As described above, the $Cu_6Sn_5$ portion 4b is provided between the solder portion 4a and the Ni film 2a. Therefore, the $Cu_6Sn_5$ portion 4b functions as a barrier layer. Therefore, even when heat is generated from the semiconductor element 6, a reaction between the solder portion 4a and the Ni film 2a can be suppressed. When the reaction between the solder portion 4a and the Ni film 2a reaches the Cu portion 2b, the metal plate 2 may be peeled off from the semiconductor element 6. Due to the $Cu_6Sn_5$ portion 4b, such peeling can be prevented.

In addition, the solder material contains the Cu balls 20. As a result, when the solder material is melted, a significant change in the shape of the solder material can be suppressed. Specifically, when the solder material is melted, the solder material does not flow from a gap between the metal plate 2 and the semiconductor element 6 such that contact between the metal plate 2 and the semiconductor element 6 can be prevented. In other words, the solder material containing the Cu balls 20 functions as a spacer which prevents the contact between the metal plate 2 and the semiconductor element 6.

Figure 5:
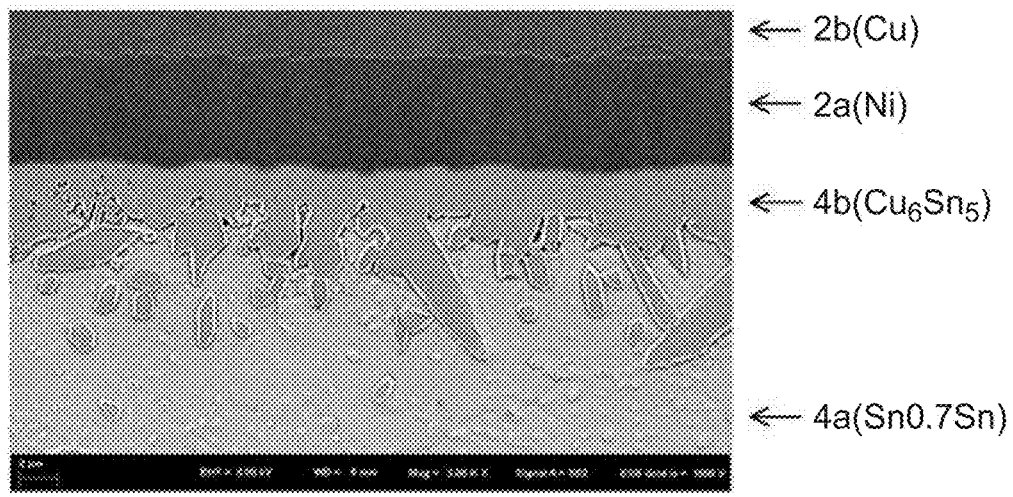
FIG. 5 is a SEM image showing a joint interface between a semiconductor element and a joined member in Example 1.
Figure 6:
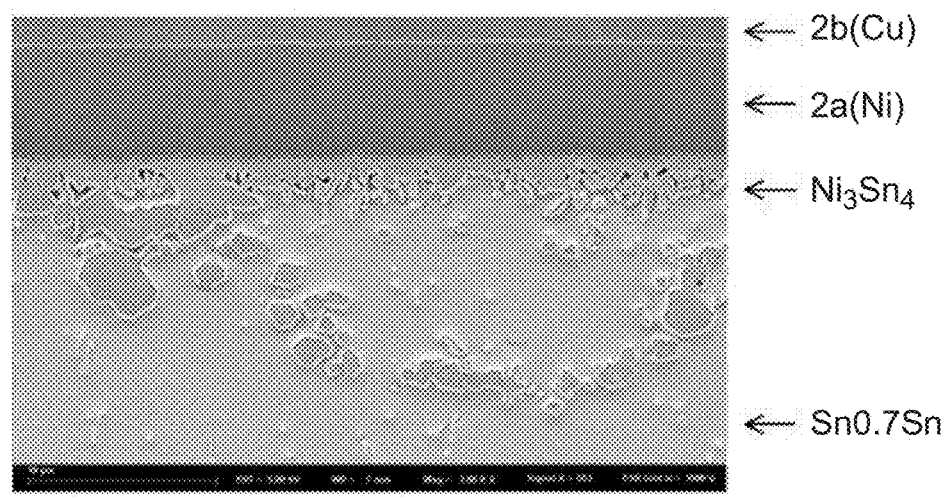
FIG. 6 is a SEM image showing a joint interface between a semiconductor element and a joined member in Comparative Example 1.

FIG. 5 is a SEM image showing a joint interface between a solder portion and a metal plate (Cu plate on which a Ni film was formed) when a semiconductor element and the metal plate were joined to each other through a solder material in which 1.3 wt % of Cu balls were introduced into base metal formed of Sn-0.7 Cu (Example 1). In addition, FIG. 6 is a SEM image showing a joint interface between a solder portion and a metal plate when a semiconductor element and the metal plate were joined to each other through a solder material formed of Sn-0.7 Cu which contained no Cu balls (Comparative Example 1).

In Example 1 and Comparative Example 1, since the base metals of the solder materials were the same (Sn-0.7 Cu solder), the melting points of the solder materials were the same. As shown in FIG. 6, in Comparative Example 1, not a $Cu_6Sn_5$ layer but a $Ni_3Sn_4$ layer was formed between the Ni film 2a and the solder portion 4a. This result shows that, when the proportion of Cu contained in base metal is low (0.7 wt %), a $Cu_6Sn_5$ layer is not formed. In Comparative Example 1, when the temperature of the joining layer increased by driving the semiconductor device, Sn in the solder portion was diffused, and a $Ni_3Sn_4$ layer grew.

On the other hand, in Example 1, the $Cu_6Sn_5$ portion 4b was formed between the Ni film 2a and the solder portion 4a. By 1.3 wt % of the Cu balls being dispersed in the base metal of Sn-0.7 Cu, the $Cu_6Sn_5$ portion was able to be formed on the surface of the metal plate without an increase in the temperature during the joining between the semiconductor element and the metal plate.

In the description of the example of the above-described embodiment, the semiconductor element and the metal plate are joined to each other through the solder material in which 1.3 wt % of the Cu balls are dispersed in the base metal of Sn-0.7 Cu. However, the same effect can be obtained even when the semiconductor element and the metal plate are joined to each other through a solder material in which 2.0 wt % of the Cu balls are dispersed in base metal of Sn (tin 100%). In this case, the melting point of the base metal of Sn is 232° C., which is lower than the liquidus temperature (270° C. to 280° C.) of the solder material of Sn-2.0 Cu.

In the description of the above-described embodiment, in the semiconductor device, each of the electrodes 6a, 6b of the semiconductor element 6, the metal plate 2, 10, and the spacer 14 includes a Cu portion (Cu plate) and a Ni film which covers the Cu portion. However, the semiconductor device may have a structure in which at least one of the electrodes 6a, 6b, the metal plates 2, 10, and the spacer 14 includes a Cu portion and a Ni film which covers the Cu portion. In a semiconductor device, the risk of defects in joint portions caused by heat varies depending on the heating conditions and the environmental temperature during the manufacturing steps, the heat generation from the semiconductor element, and the like. In the semiconductor device 100, defects are likely to occur due to heat in the portions that are in direct contact with the semiconductor element 6. That is, in the semiconductor device 100, defects are likely to occur in the joint portion between the metal plate 2 and the semiconductor element 6 and the joint portion between the semiconductor element 6 and the spacer 14. In particular, defects are likely to occur in the joint portion between the semiconductor element 6 and the spacer 14. The technique relating to the joining layer (the solder portion containing elemental copper in the base metal, and the $Cu_6Sn_5$ portion in contact with the nickel film) disclosed in this specification may be applied to only the above-described portions where defects are likely to occur.

The characteristics of the solder material used in the semiconductor device disclosed in this specification will be summarized. The solder material contains: base metal (hereinafter, also referred to as "solder base metal") containing at least tin as a constituent element; and elemental copper which is introduced into the solder base metal. The proportion of tin in the solder base metal may be 100% (Cu content ratio: 0 wt %). In addition, when the solder base metal is Sn—Cu solder, the Cu content ratio in the solder base metal may be 0.3 wt % or higher and is preferably 0.5 wt % or higher. It is more preferable that the solder base metal is Sn-0.7 Cu (Cu content ratio: 0.7%). In addition, the Cu content ratio in the solder base metal may be 7.6 wt % or lower and is preferably 5.0 wt % or lower and more preferably 4.0 wt % or lower.

Some technical characteristics of the semiconductor device disclosed in this specification will be described. The following features have individual technical significance.

The semiconductor device includes: a semiconductor element; a joined member that is joined to the semiconductor element and includes a nickel film; and a joining layer that is joined to the joined member. The joining layer may include: a solder portion; and a $Cu_6Sn_5$ portion that is in contact with the nickel film. The base metal of the solder portion may contain at least tin as a constituent element. In addition, the solder portion may contain elemental copper (Cu) in the base metal. The proportion of Cu contained in the joining layer may be 2.0 wt % or higher.

The proportion of tin (Sn) in the base metal of the solder portion may be 100%. In addition, the base metal of the solder portion may be a compound (Sn—Cu solder) of Cu and Sn. The elemental Cu may not constitute the base metal of the solder portion. The elemental Cu may be particulate. The elemental Cu may be dispersed in the base metal of the solder material in advance before the semiconductor element and the joined member are joined to each other. When the semiconductor element and the joined member are joined to each other, the $Cu_6Sn_5$ portion may be deposited on the surface of the joined member (surface of the nickel film).

When the base metal of the solder portion is Sn—Cu solder, the Cu content ratio in the base metal may be 0.3 wt % or higher and is preferably 0.5 wt % or higher. As clearly seen from FIG. 3, in Sn-0.3 Cu solder and Sn-0.5 Cu solder, an η (eta) phase compound ($Cu_6Sn_5$) is formed during phase transformation from the liquid phase to the solid phase. By adjusting the Cu content ratio contained in Sn—Cu solder to be 0.3 wt % or higher, the $Cu_6Sn_5$ portion can be formed on the surface of the nickel film even when the dispersion of the elemental Cu in the base metal of the solder material is insufficient. By adjusting the Cu content ratio to be 0.5 wt % or higher, the $Cu_6Sn_5$ portion can be more reliably formed. In addition, "Sn—Cu solder" is a general term for alloys containing tin and copper as major components and may further contain, for example, Ni, P (phosphorus), Bi (bismuth), Sb (antimony), or Ag (silver) in addition to tin and copper.

Figure 4:
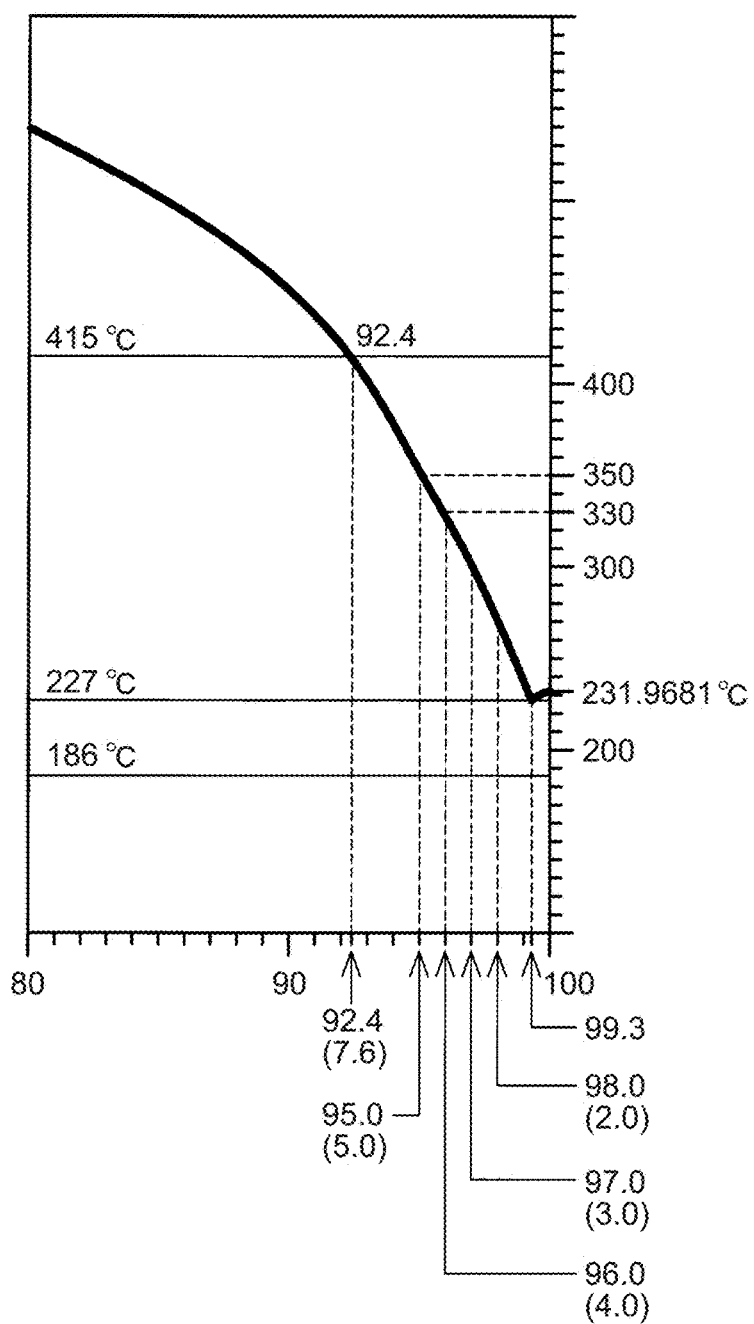
FIG. 4 is an enlarged view showing a part (Sn: 80 to 100) of FIG. 3.

The Cu content ratio in the base metal of the solder portion may be 7.6 wt % or lower and is preferably 5.0 wt % or lower and more preferably 4.0 wt % or lower. As shown in FIGS. 3 and 4, when the Cu content ratio in the Sn—Cu solder is higher than 7.6 wt %, an ϵ (upsilon) phase compound ($Cu_3Sn$) is formed during phase transformation of the base metal from the liquid phase to the solid phase. On the other hand, when the Cu content ratio is 7.6 wt % or lower, an η (eta) phase compound ($Cu_6Sn_5$) is formed during phase transformation of the base metal from the liquid phase to the solid phase. By adjusting the Cu content ratio in the base metal of the solder portion to be 7.6 wt % or lower, the $Cu_6Sn_5$ portion can be reliably formed.

As shown in FIG. 4, the Sn—Cu solder (Sn-5.0 Cu solder) in which the Cu content ratio is 5.0 wt % has a melting point of 350° C. An element protective film used for a semiconductor element may deteriorate at a temperature higher than 350° C. Therefore, when the Cu content ratio is higher than 5.0 wt %, it is necessary to take countermeasures to suppress deterioration of the element protective film. By adjusting the Cu content ratio in the base metal of the solder portion (solder material) to be 5.0 wt % or lower, deterioration of the element protective film can be suppressed without taking any special countermeasures.

As shown in FIG. 4, the Sn—Cu solder (Sn-4.0 Cu solder) in which the Cu content ratio is 4.0 wt % has a melting point of 330° C. An electrode used in a semiconductor element may be cracked at a temperature of higher than 330° C. depending on the material thereof. Therefore, when the Cu content ratio is higher than 4.0 wt %, it is necessary to take countermeasures for preventing the cracking of an electrode. For example, it is necessary to limit the material of an electrode. By adjusting the Cu content ratio to be 4.0 wt % or lower, a semiconductor device in which the cracking of an electrode is suppressed can be obtained without taking any special countermeasures. It is more preferable that the base metal of the solder portion (and the base metal of the solder material) is Sn-0.7 Cu (Cu content ratio: 0.7%), rather than reducing the melting point of the base metal of the solder material in the Sn-0.1 to 7.6 Cu to be as low as possible.

The proportion of Cu contained in the joining layer (the base metal, the elemental Cu, and the $Cu_6Sn_5$ portion of the solder portion) may be 2.0 wt % or higher and is preferably 3.0 wt % or higher. As clearly seen from FIGS. 3 and 4, in Sn-2.0 Cu solder, an η (eta) phase compound ($Cu_6Sn_5$) is formed during phase transformation from the liquid phase to the solid phase. That is, by adjusting the proportion of Cu contained in the joining layer to be 2.0 wt % or higher, the $Cu_6Sn_5$ portion can be reliably formed on the surface of the nickel film. In addition, by adjusting the proportion of Cu contained in the joining layer to be 3.0 wt % or higher, the $Cu_6Sn_5$ portion can be more stably formed on the surface of the nickel film. The proportion of the elemental Cu may be adjusted depending on the proportion of Cu constituting the base metal of the solder portion. As described above, from the viewpoint of reliably forming the $Cu_6Sn_5$ portion, the proportion of Cu contained in the joining layer is preferably 7.6 wt % or lower.

Hereinabove, specific examples of the invention have been described in detail. However, these examples are merely exemplary and do not limit the claims. The technique described in the claims includes various modifications and alternations of the above-described specific examples. The technical features described in this specification and the drawings exhibit technical significance when being used alone or in a combination thereof, and are not limited to the combinations described in the claims at the time of filing of the application. The technique exemplified in this specification or the drawings simultaneously achieves plural objects, and the technical significance is obtained by achieving one of the objects.

What is claimed is:

1. A semiconductor device comprising:
   a semiconductor element;
   a joined member that is joined to the semiconductor element and includes a nickel film; and
   a joining layer that is joined to the joined member and contains 2.0 wt % or higher of copper,
   wherein
   the joining layer includes a solder portion and a $Cu_6Sn_5$ portion,
   base metal of the solder portion contains at least tin as a constituent element and contains elemental copper, and
   the $Cu_6Sn_5$ portion is in contact with the nickel film.

2. The semiconductor device according to claim 1, wherein
   a proportion of copper contained in the joining layer is 7.6 wt % or lower.

3. The semiconductor device according to claim 1, wherein
   the base metal is an alloy containing tin and copper as major components.

4. The semiconductor device according to claim 3, wherein
   the base metal is an alloy containing Sn-0.7Cu as a major component.

5. A method of manufacturing the semiconductor device of claim 1, comprising:
   joining a semiconductor element to a joined member, which includes a nickel film, through a solder material whose base metal contains at least tin as a constituent element and contains elemental copper in which a proportion of copper is 2.0 wt % or higher.

6. The method according to claim 5, wherein
the semiconductor element is joined to the nickel film which is on the joined member through the solder material.

7. The semiconductor device according to claim 1, wherein
the elemental copper is in the form of particles consisting of copper that are dispersed in the base metal.

* * * * *